United States Patent
Cho et al.

(10) Patent No.: US 10,497,671 B2
(45) Date of Patent: Dec. 3, 2019

(54) SEMICONDUCTOR PACKAGES INCLUDING CHIP STACKS

(71) Applicant: SK hynix Inc., Icheon-si, Gyeonggi-do (KR)

(72) Inventors: Kyung Hwan Cho, Icheon-si (KR); Ga Hyun No, Seoul (KR); Jin Kyoung Park, Suwon-si (KR); Yong Kuk Kim, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/058,549

(22) Filed: Aug. 8, 2018

(65) Prior Publication Data

US 2019/0221542 A1    Jul. 18, 2019

(30) Foreign Application Priority Data

Jan. 15, 2018    (KR) .................. 10-2018-0005270

(51) Int. Cl.
*H01L 23/48*    (2006.01)
*H01L 25/065*    (2006.01)

(52) U.S. Cl.
CPC .. *H01L 25/0652* (2013.01); *H01L 2225/0651* (2013.01); *H01L 2225/06506* (2013.01); *H01L 2225/06562* (2013.01); *H01L 2225/06586* (2013.01)

(58) Field of Classification Search
None
See application file for complete search history.

(56) References Cited

U.S. PATENT DOCUMENTS

| | | | |
|---|---|---|---|
| 8,415,808 B2 | 4/2013 | Liao et al. | |
| 2009/0065948 A1* | 3/2009 | Wang | H01L 24/49 257/777 |
| 2014/0175673 A1 | 6/2014 | Kim et al. | |
| 2015/0155266 A1 | 6/2015 | Kim et al. | |
| 2015/0200187 A1* | 7/2015 | Park | H01L 24/32 257/777 |
| 2016/0099203 A1* | 4/2016 | Kim | H01L 25/0652 257/773 |
| 2017/0125378 A1 | 5/2017 | Park et al. | |

* cited by examiner

*Primary Examiner* — Hung K Vu
(74) *Attorney, Agent, or Firm* — William Park & Associates LTD.

(57) ABSTRACT

A semiconductor package may include a first chip stack, a second chip stack, and a third chip stack. The third chip stack may include third semiconductor chips, the third chip stack coupled to both of the first and second chip stacks.

6 Claims, 8 Drawing Sheets

SEMICONDUCTOR PACKAGES INCLUDING CHIP STACKS

CROSS-REFERENCE TO RELATED APPLICATIONS

The present application claims priority under 35 U.S.C 119(a) to Korean Application No. 10-2018-0005270, filed on Jan. 15, 2018, which is incorporated herein by references in its entirety.

BACKGROUND

1. Technical Field

Various embodiments generally relate to semiconductor package technologies and, more particularly, to semiconductor packages including chip stacks.

2. Related Art

Semiconductor packages having a large capacity have been required in various electronic products. Accordingly, various package structures have been proposed to increase the number of semiconductor chips embedded in a single semiconductor package. For example, at least two semiconductor chips may be stacked to provide a stack package. Form factors such as thickness and size of the semiconductor packages may be limited. A lot of effort has been focused on embedding a plurality of semiconductor chips in a single semiconductor package having a limited thickness and/or a limited size.

SUMMARY

According to an embodiment, a semiconductor package may be provided. The semiconductor package may include a first chip stack, a second chip stack, and a third chip stack. The third chip stack may include third semiconductor chips which are stacked to be offset and supported by both of the first and second chip stacks.

According to another embodiment, a semiconductor package may be provided. The semiconductor package may include a first chip stack including first semiconductor chips which are stacked to be offset on a package substrate, a second chip stack including second semiconductor chips which are stacked to be offset on the package substrate, and a third chip stack including third semiconductor chips which are stacked to be offset and supported by both of the first and second chip stacks. The semiconductor package may include connectors having first ends which are connected to the first, the second, and the third semiconductor chips. The semiconductor package may include bonding fingers connected to second ends of the connectors opposite to the first ends. The bonding fingers may be arrayed on the package substrate along a first edge of the package substrate, a second edge of the package substrate opposite to the first edge, and a third edge of the package substrate connecting the first edge to the second edge.

According to another embodiment, a semiconductor package may be provided. The semiconductor package may include a first chip stack on a package substrate. The first chip stack may include first semiconductor chips which are stacked to be offset. The semiconductor package may include a second chip stack on a package substrate. The second chip stack may include second semiconductor chips which are stacked to be offset. The semiconductor package may include a third chip stack configured to bind the first chip stack with the second chip stack to prevent either the first and second chip stacks from collapsing.

DETAILED DESCRIPTION

Various embodiments of the present disclosure will be described hereinafter with reference to the accompanying drawings. However, the embodiments described here are for illustrative purposes only and are not intended to limit the scope of the present disclosure.

The terms used herein may correspond to words selected in consideration of their functions in embodiments of the present disclosure, and the meanings of the terms may be construed to be different according to ordinary skill in the art to which embodiments of the present disclosure belong. If defined in detail, the terms may be construed according to the definitions. Unless otherwise defined, the terms (including technical and scientific terms) used herein have the same meaning as commonly understood by one of ordinary skill in the art to which embodiments of the present disclosure belong.

It will be understood that although the terms "first," "second," "third" etc. may be used herein to describe various elements, these elements should not be limited by these terms. These terms are only used to distinguish one element from another element, but not used to define only the element itself or to mean a particular sequence.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips (including application specific integrated circuits (ASIC) chips), or system-on-chips (SoC). The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (Re-RAM) circuits, ferroelectric random access memory (Fe-RAM) circuits, or phase change random access memory (PcRAM) circuits which are integrated on the semiconductor substrate. The logic chips may include logic circuits which are integrated on the semiconductor substrate. The semiconductor package may be employed in communication systems such as mobile phones, electronic systems associated with biotechnology or health care, or wearable electronic systems.

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 1:
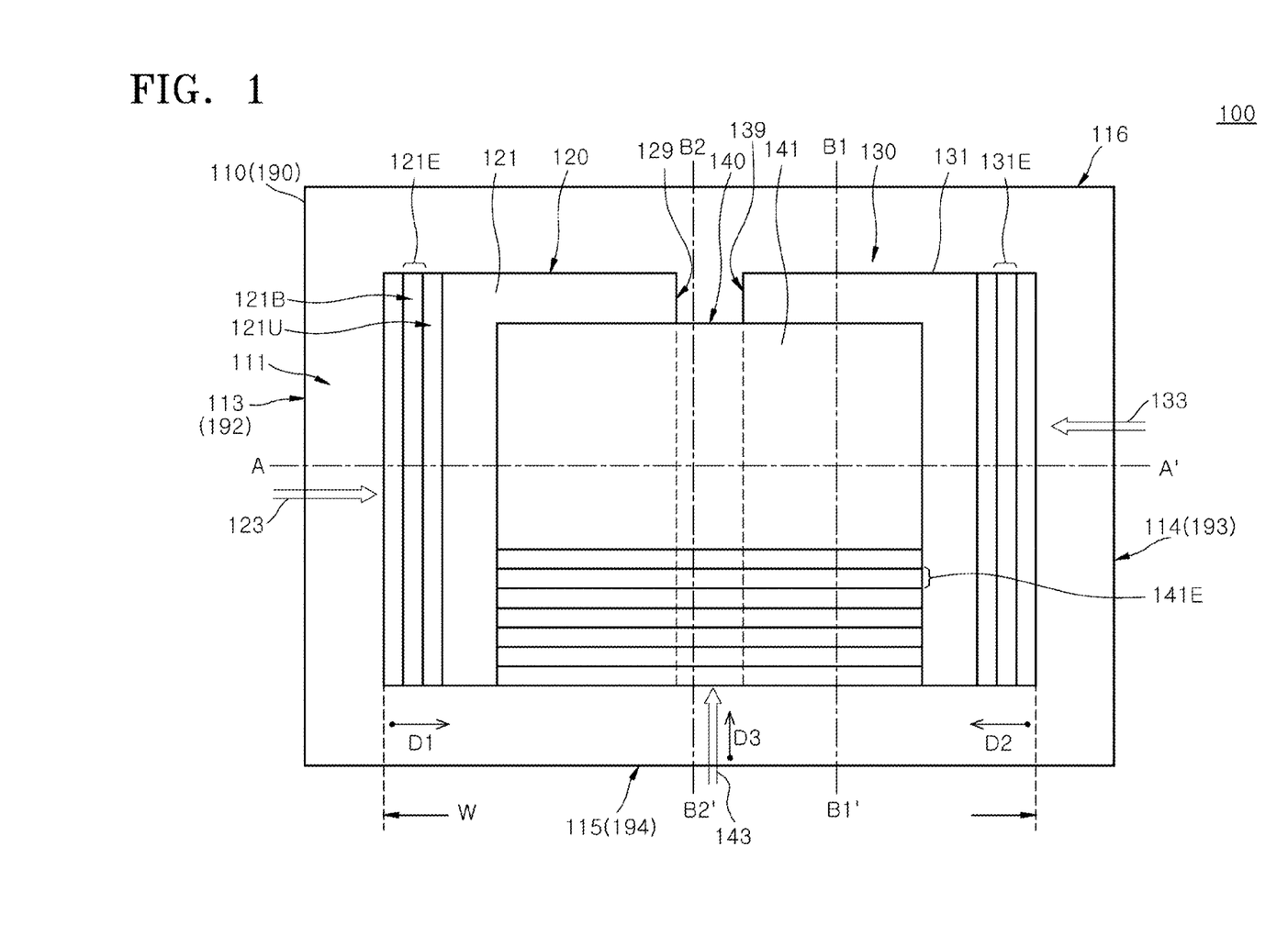
FIG. 1 is a plan view illustrating a semiconductor package according to an embodiment.
Figure 2:
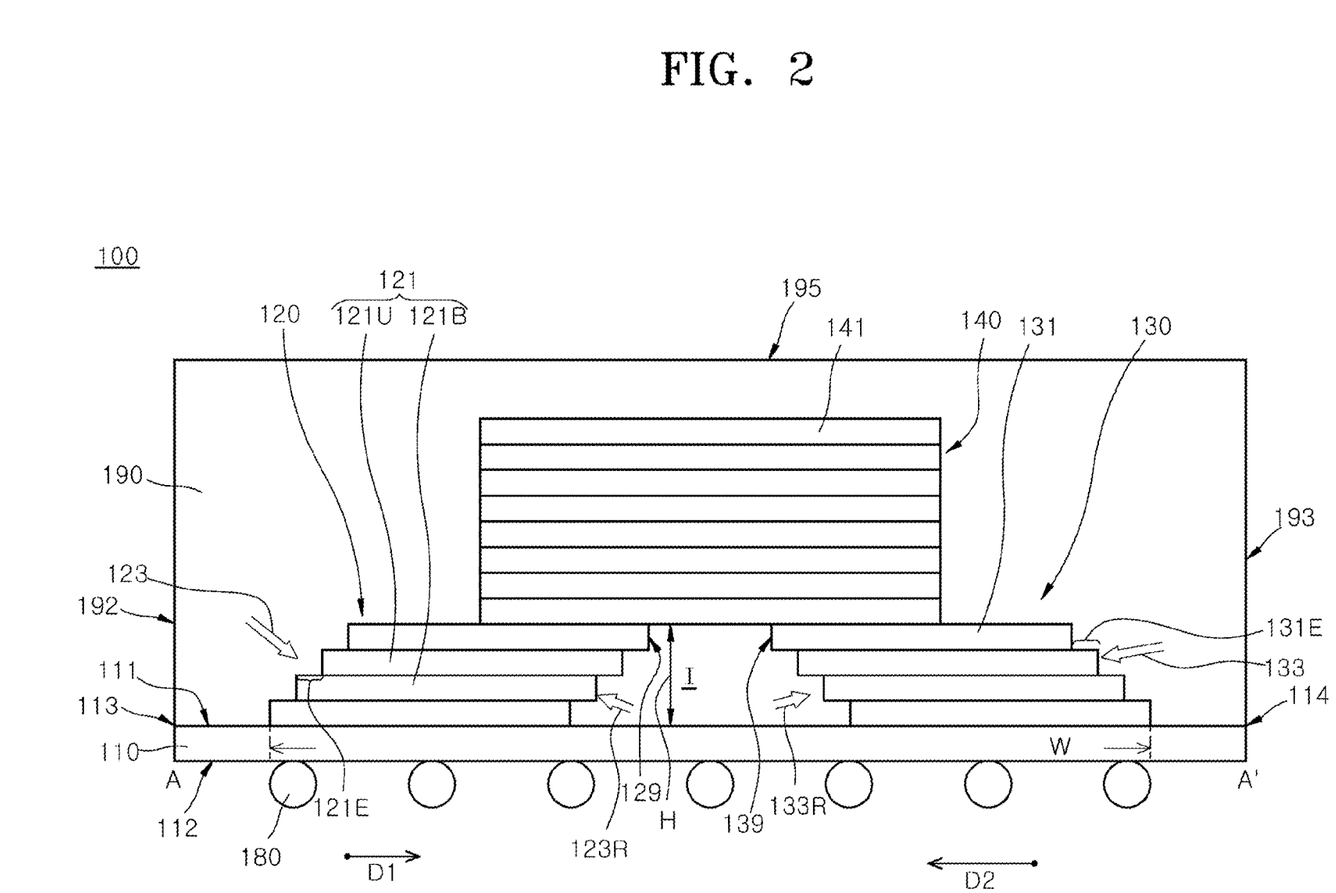
FIG. 2 is a cross-sectional view taken along a line A-A' of FIG. 1.
Figure 3:
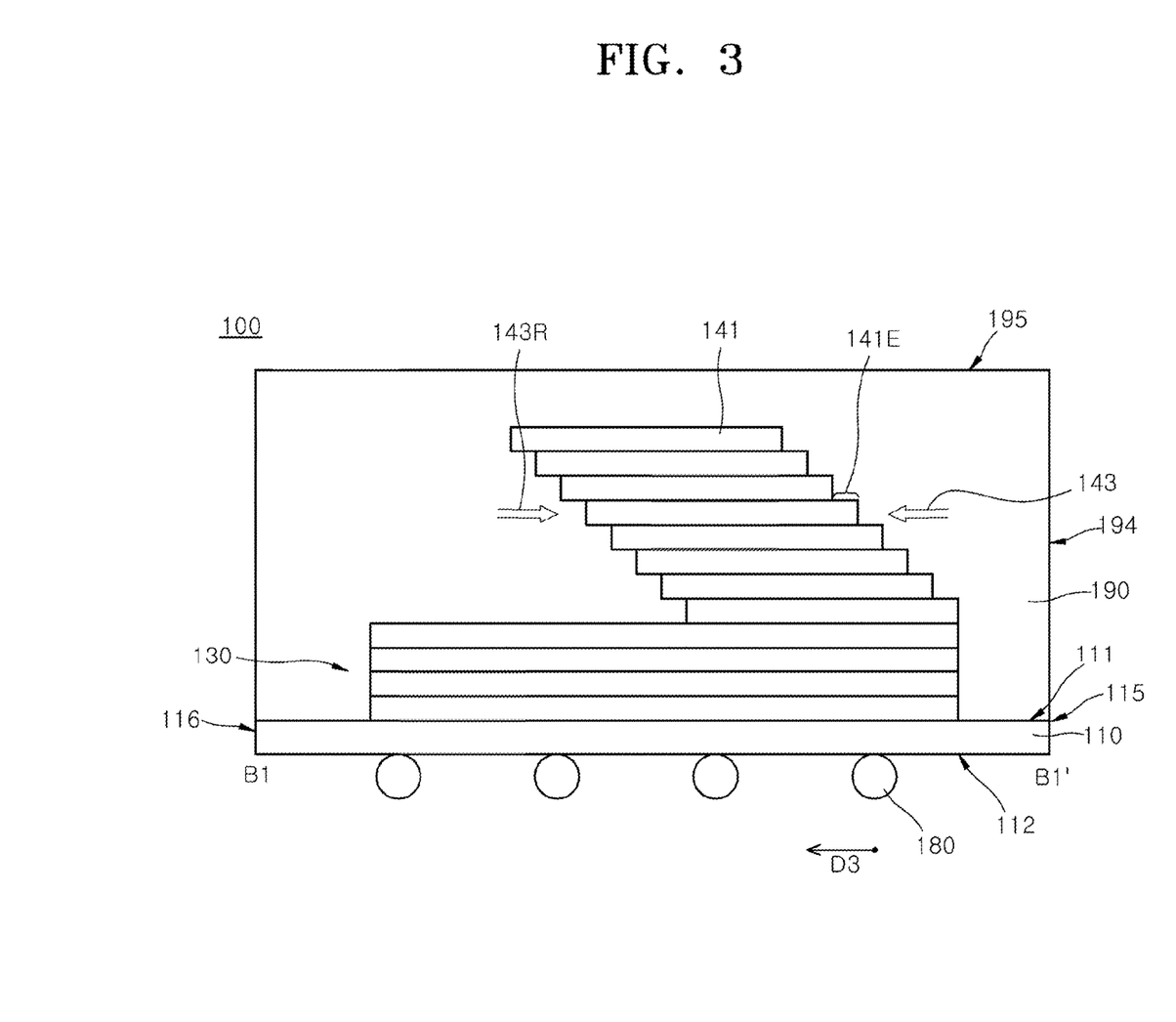
FIG. 3 is a cross-sectional view taken along a line B1-B1' of FIG. 1.
Figure 4:
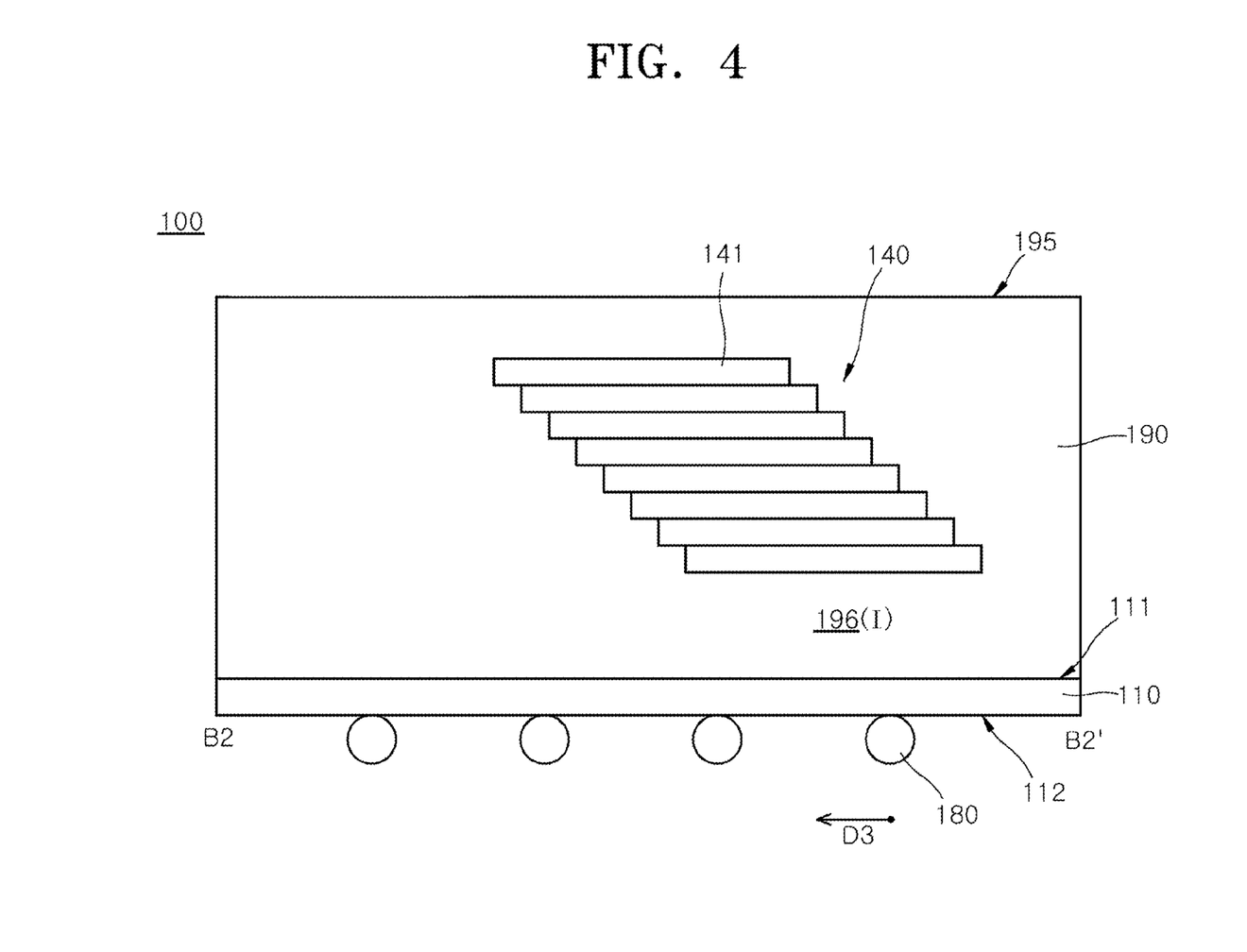
FIG. 4 is a cross-sectional view taken along a line B2-B2' of FIG. 1.

FIG. 1 is a plan view illustrating a semiconductor package 100 according to an embodiment. FIG. 2 is a cross-sectional view taken along a line A-A' of FIG. 1. FIG. 3 is a cross-sectional view taken along a line B1-B1' of FIG. 1. FIG. 4 is a cross-sectional view taken along a line B2-B2' of FIG. 1.

Referring to FIGS. 1 and 2, the semiconductor package 100 may be configured to include a first chip stack 120, a second chip stack 130, and a third chip stack 140. The first chip stack 120 and the second chip stack 130 may be disposed on a first surface 111 of a package substrate 110. The first chip stack 120 and the second chip stack 130 may be disposed to be spaced apart from each other in a plan view. The first chip stack 120 and the second chip stack 130 may be disposed to support the third chip stack 140. The first chip stack 120 and the second chip stack 130 may act like piers to support the third chip stack 140. Accordingly, both ends of the third chip stack 140 may be respectively put on the first and second chip stacks 120 and 130 like a bridge deck.

The first chip stack 120 may be a stack structure including first chips 121 which are stacked on the package substrate 110. The second chip stack 130 may be a stack structure including second chips 131 which are stacked on the package substrate 110. The first chip stack 120 and the second chip stack 130 may be disposed on the package substrate 110 to face each other. The first chip stack 120 and the second chip stack 130 may be disposed on the package substrate 110 to have symmetric structures about a vertical line (not illustrated) therebetween.

The first chip stack 120 and the second chip stack 130 may be disposed on substantially the same plane and may be laterally spaced apart from each other to support the third chip stack 140. Accordingly, a space (I of FIG. 2) may be provided between the first chip stack 120 and the second chip stack 130, and the space I may be located under the third chip stack 140. The third chip stack 140 may be spaced apart from the first surface 111 of the package substrate 110 by a distance corresponding to a height H of the first or second chip stack 120 or 130.

The first chip stack 120 and the second chip stack 130 may have substantially the same height H. The first chip stack 120 may have an overhang that laterally protrudes toward the second chip stack 130. The first chip stack 120 may have a first corner 129 that protrudes toward the second chip stack 130 that is closest in proximity to the second chip stack 130, in relation to other corners of the first chip stack 120 (i.e., compared to distances of other corners of the first chip stack 120 from the second chip stack 130). The second chip stack 130 may have an overhang that laterally protrudes toward the first chip stack 120. The second chip stack 130 may have a second corner 139 that protrudes toward the first chip stack 120 that is closest in proximity to the first chip stack 120, in relation to other corners of the second chip stack 130 (i.e., compared to distances of other corners of the second chip stack 130 from the second chip stack 120). The first corner 129 and the second corner 139 may be located at substantially the same level. The height H of the first chip stack 120 may correspond to a distance between the first surface 111 of the package substrate 110 and a top surface of a topmost chip of the first chips 121 constituting the first chip stack 120. Since the first chip stack 120 and the second chip stack 130 have substantially the same height H, the third chip stack 140 may be stably supported by the first chip stack 120 and the second chip stack 130. Since the first chip stack 120 and the second chip stack 130 have substantially the same height H, the third chip stack 140 may keep horizontality. Thus, third chips 141 constituting the third chip stack 140 may be stably stacked so that the third chip stack 140 stably hangs over the first and second chip stacks 120 and 130.

Since the third chip stack 140 is put on the first and second chip stacks 120 and 130, the first and second chip stacks 120 and 130 may be strongly fixed by the third chip stack 140 if the third chip stack 140 is bonded to or combined with the first and second chip stacks 120 and 130. Thus, the third chip stack 140 may suppress collapse or warpage of the first and second chip stacks 120 and 130 that may cause stack failure. That is, the third chip stack 140 may act as a binding member of the first and second chip stacks 120 and 130. Accordingly, even though the number of the first chips 121 constituting the first chip stack 120 and the number of the second chips 131 constituting the second chip stack 130 increases, the first to third chip stacks 120, 130, and 140 may provide a stable structure.

Referring again to FIGS. 1 and 2, the first chips 121 of the first chip stack 120 may be stacked to be offset in a first lateral direction to provide a step structure. The second chips 131 of the second chip stack 130 may be stacked to be offset in a second lateral direction opposite to the first lateral direction to provide a step structure. The first and second chip stacks 120 and 130 may have symmetric structures.

In an embodiment, the first chips 121 may be stacked to be offset in a first offset direction D1. For example, if one of the first chips 121 corresponds to a first upper chip 121U and another one of the first chips 121 corresponds to a first lower chip 121B located beneath the first upper chip 121U, the first upper chip 121U may be laterally offset relative to the first lower chip 121B by a certain distance in a first offset direction D1. The first upper chip 121U may be stacked on the first lower chip 121B to expose a first edge region 121E of the first lower chip 121B. That is, the first upper chip 121U may be stacked on the first lower chip 121B to expose the first edge region 121E of the first lower chip 121B opposite to the second chip stack 130. As such, the first chips 121 may be sequentially stacked to be offset in the first offset direction D1 to provide the first chip stack 120.

The first chip stack 120 may have a first up-stair structure 123 toward the first offset direction D1. The first up-stair structure 123 may have ascending steps from the first surface 111 of the package substrate 110 toward the third chip stack 140. The first up-stair structure 123 may be provided to face a first side surface 192 of an encapsulant 190 covering the first, second, and third chip stacks 120, 130, and 140. The first up-stair structure 123 may be provided to reveal the first edge regions 121E of the first chips 121 opposite to the second chip stack 130. In such a case, the revealed first edge regions 121E of the first chips 121 may be located to be relatively closer to a first edge 113 corresponding to a corner of the package substrate 110 than any other edges of the package substrate 110. The first up-stair structure 123 may be provided to be adjacent to the first edge 113.

The first chip stack 120 may have a first reverse stair structure 123R which is opposite to the first up-stair structure 123. The first reverse stair structure 123R may have a reversed shape of the first up-stair structure 123.

The second chips 131 may be stacked to be offset in a second offset direction D2 to provide the second chip stack 130. The second offset direction D2 may be an opposite direction of the first offset direction D1. The second chips 131 may be stacked to be sequentially offset by a certain distance in the second offset direction D2. The second chip stack 130 may have a second up-stair structure 133 toward the second offset direction D2. The second up-stair structure 133 may have ascending steps from the first surface 111 of the package substrate 110 toward the third chip stack 140. The second up-stair structure 133 may be provided to face a second side surface 193 of the encapsulant 190. The second up-stair structure 133 may be provided to expose second edge regions 131E of the second chips 131 opposite to the first chip stack 120. In such a case, the revealed second edge regions 131E of the second chips 131 may be located to be relatively closer to a second edge 114 of the package substrate 110, opposite to the first edge 113, than any other edges of the package substrate 110.

The second chip stack 130 may have a second reverse stair structure 133R which is opposite to the second up-stair structure 133. The second reverse stair structure 133R may have a reversed shape of the second up-stair structure 133. The second reverse stair structure 133R may be located to face the first reverse stair structure 123R. Thus, as a level over the first surface 111 of the package substrate 110 becomes closer to the third chip stack 140, a distance between the first chip stack 120 and the second chip stack 130 at the level may be reduced. The second up-stair structure 133 may be provided to be adjacent to the second edge 114. A distance W may be provided between the most outer side edge of the first chip stack 120 closest in proximity to the first edge 113 of the package substrate 110 (e.g., side edge of the most bottom chip of the first chips 121 facing the first edge 113) and the most outer side edge of the second chip stack 130 closest in proximity to the second edge 114 of the package substrate 110 (e.g, side edge of the most bottom chip of the second chips 131 facing the second edge 114).

Since the first and second chip stacks 120 and 130 are disposed to face each other as described above, the first to third chip stacks 120, 130, and 140 may exhibit a cross-sectional view which is similar to a triangular shape or a trapezoidal shape as illustrated in FIG. 2. Thus, the third chip stack 140 may be stably supported by the first and second chip stacks 120 and 130. That is, even though the number of the third chips 141 constituting the third chip stack 140 increases, the third chips 141 may be stably stacked so that the third chip stack 140 stably hangs over the first and second chip stacks 120 and 130. Accordingly, the number of the third chips 141 may be greater than the number of the first or second chips 121 or 131, as illustrated in FIG. 2. For example, the number of the first chips 121 may be equal to the number of the second chips 131, and the number of the third chips 141 may be twice that of the number of the first or second chips 121 or 131.

Referring to FIGS. 1 and 3, the third chips 141 may be stacked to be offset in a third offset direction D3. That is, the first offset direction D1 of the first chips 121, the second offset direction D2 of the second chips 131, and the third offset direction D3 of the third chips 141 may be different from each other. The third offset direction D3 may intersect the first and second offset directions D1 and D2 at a certain angle, for example, a right angle when viewed from a plan view. For example, the third offset direction D3 may be a direction from a third edge 115 of the package substrate 110 toward a fourth edge 116 of the package substrate 110 opposite to the third edge 115. The third edge 115 may be an edge of the package substrate 110 that connects the first edge 113 of the package substrate 110 to the second edge 114 of the package substrate 110. The first offset direction D1 may be a direction from the first edge 113 toward the second edge 114, and the second offset direction D2 may be a direction from the second edge 114 toward the first edge 113.

The third chips 141 may be sequentially stacked to be respectively shifted by a certain distance in the third offset direction D3. The third chip stack 140 may have a third up-stair structure 143 toward the third offset direction D3. The third up-stair structure 143 may have ascending steps from the first and second chip stacks 120 and 130 toward a top surface 195 of the encapsulant 190. The third up-stair structure 143 may be provided to face a third side surface 194 of the encapsulant 190. The third side surface 194 of the encapsulant 190 may connect the first side surface 192 of the encapsulant 190 to the second side surface 193 of the encapsulant 190.

The third up-stair structure 143 may be provided to expose third edge regions 141E of the third chips 141. In such a case, the revealed third edge regions 141E of the third chips 131 may be located to be relatively closer to a third edge 115 of the package substrate 110 than any other edges of the package substrate 110. As illustrated in FIG. 3, the third chip stack 140 may have a third reverse stair structure 143R which is opposite to the third up-stair structure 143. The third reverse stair structure 143R may have a reversed shape of the third up-stair structure 143.

Referring to FIGS. 1, 2, and 4, both lower portions of the third chip stack 140 may be supported by the first and second chip stacks 120 and 130, respectively. The space I between the first and second chip stacks 120 and 130 may be filled with a portion 196 of the encapsulant 190. As such, the third chip stack 140 may be located to be spaced apart from the first surface 111 of the package substrate 110 by a thickness of the portion 196 of the encapsulant 190. The portion 196 of the encapsulant 190 may support a bottom surface of the third chip stack 140. Meanwhile, the first and second chip stacks 120 and 130 may be in direct contact with the first surface 111 of the package substrate 110 and may be supported by the package substrate 110.

Referring again to FIG. 2, the package substrate 110 may be configured to include an interconnection structure. For example, the package substrate 110 may include a printed circuit board (PCB), an interposer, or a flexible printed circuit board (FPCB). Outer connectors 180, for example, solder balls or bumps may be disposed on a second surface 112 of the package substrate 110 opposite to the first and second chip stacks 120 and 130. The outer connectors 180 may electrically or signally connect the first to third chip stacks 120, 130, and 140 (i.e., the first to third chips 121, 131, and 141) on the first surface 111 of the package substrate 110 to an external device (not illustrated).

The semiconductor package 100 may be configured to include the encapsulant 190. The encapsulant 190 may be formed to cover the first surface 111 of the package substrate 110 and to fully or partially cover the first to third chip stacks 120, 130, and 140. The encapsulant 190 may be formed using a molding process. The encapsulant 190 may be formed to include at least one of various dielectric materials or at least one of various insulation materials. For example, the encapsulant 190 may be formed of an epoxy molding compound (EMC) material using a molding process.

The first, second, and third chips 121, 131, and 141 constituting the first, second, and third chip stacks 120, 130, and 140 may be semiconductor chips having the same size (i.e., the same thickness and width), the same shape, and the same function. Alternatively, at least two chips among the first, second, and third chips 121, 131, and 141 may have different sizes, different shapes, or different functions. At least two chips of the first, second, or third chip 121, 131, or 141 may have different chips in size or in function. At least two chips of the first, second, and third chips 121, 131, and 141 may have different integrated circuits. In an embodiment, all of the first, second, and third chips 121, 131, and 141 may be memory chips, each of which includes a plurality of memory cells.

Figure 5:
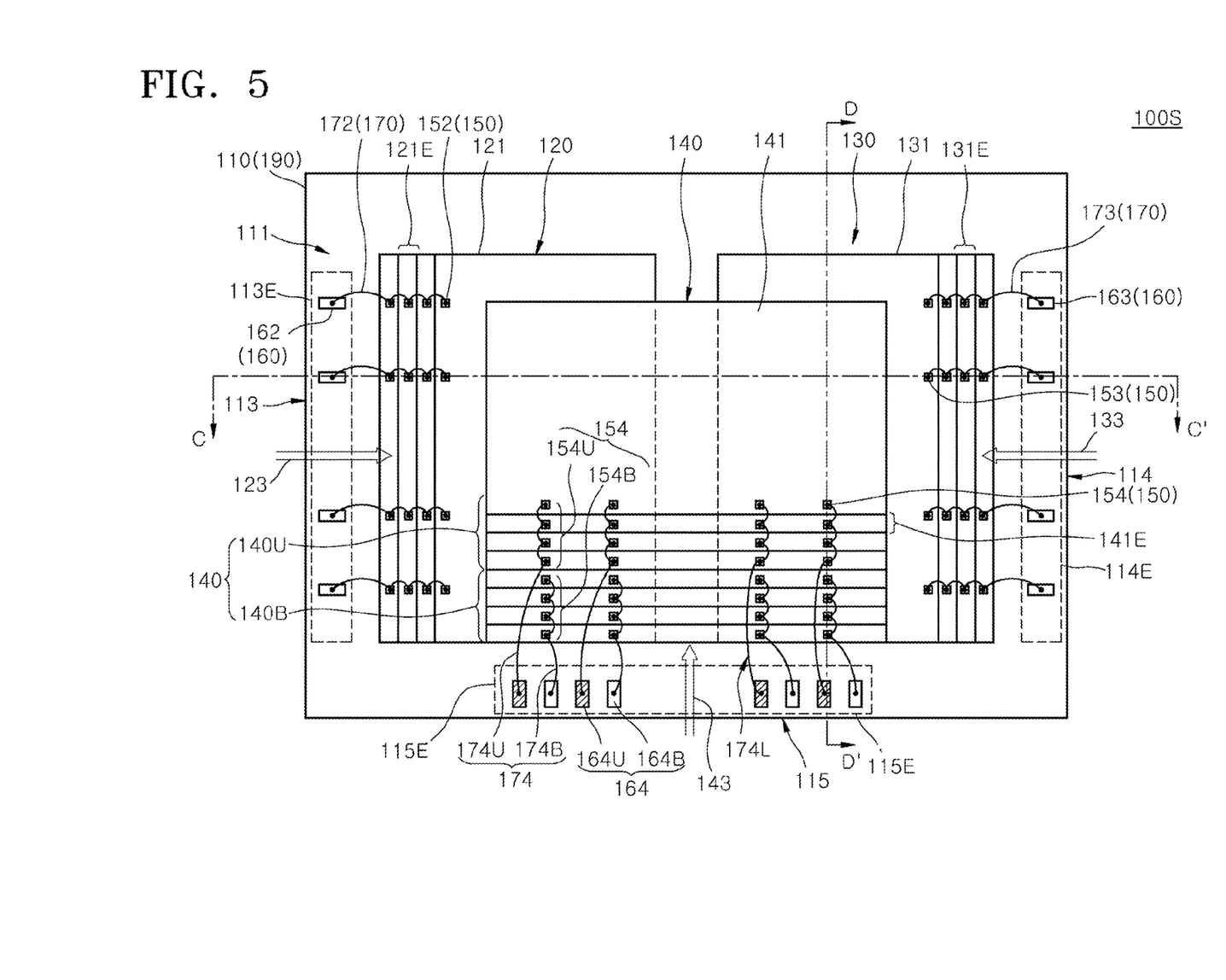
FIG. 5 is a plan view illustrating a semiconductor package according to another embodiment.
Figure 6:
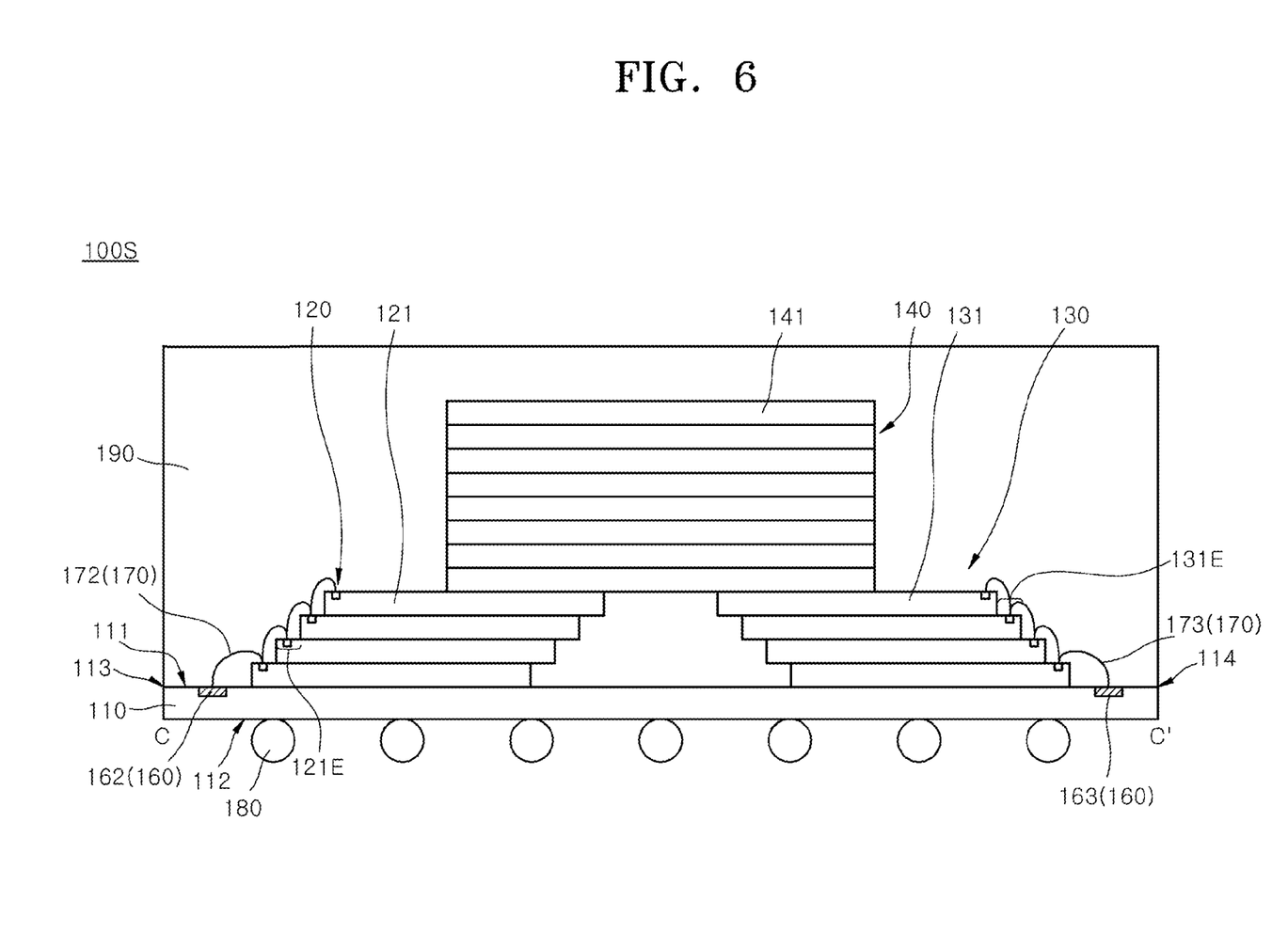
FIG. 6 is a cross-sectional view taken along a line C-C' of FIG. 5.
Figure 7:
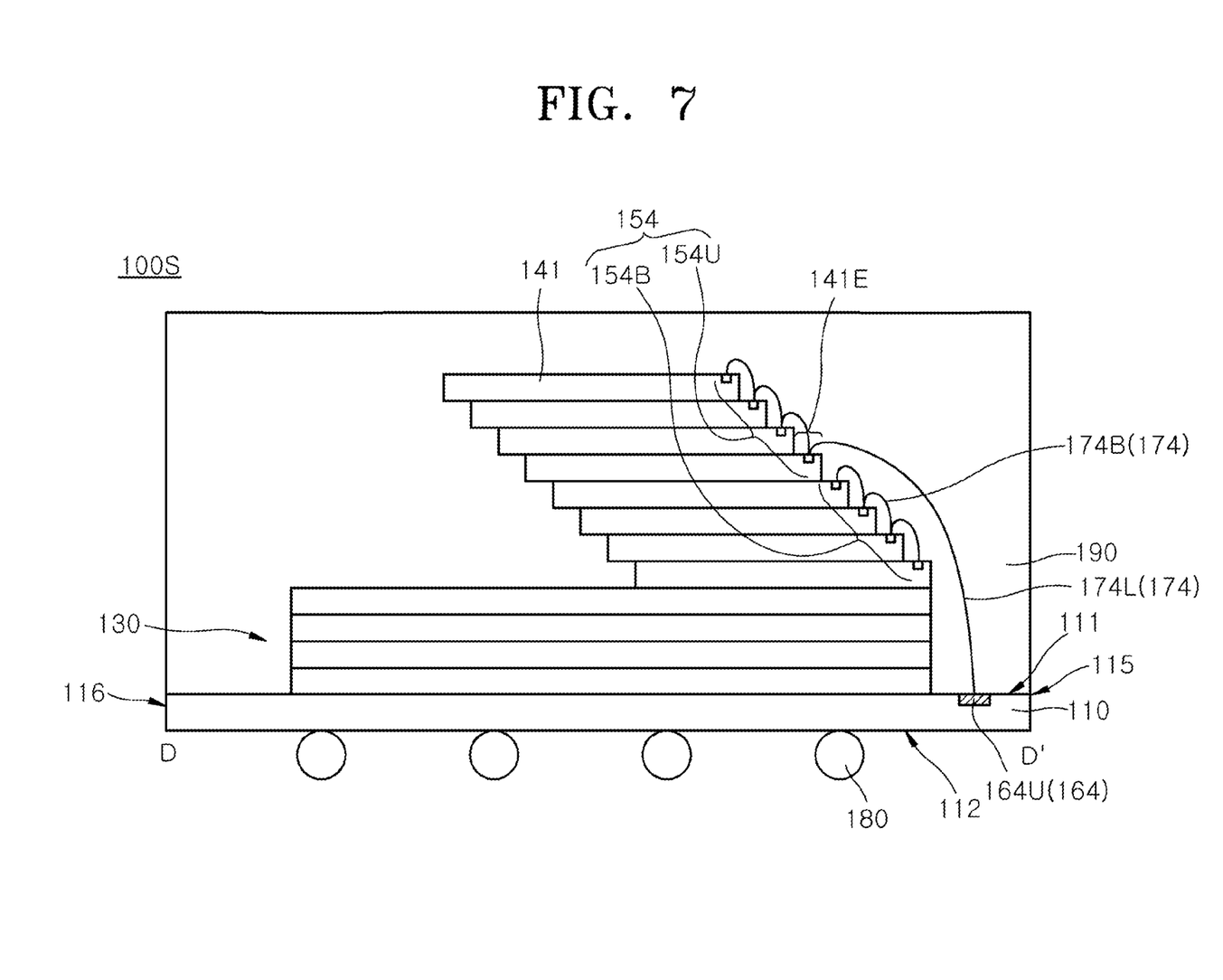
FIG. 7 is a cross-sectional view taken along a line D-D' of FIG. 5.

FIG. 5 is a plan view illustrating a semiconductor package 100S according to another embodiment. FIG. 6 is a cross-sectional view taken along a line C-C' of FIG. 5, and FIG. 7 is a cross-sectional view taken along a line D-D' of FIG. 5. The semiconductor package 100S illustrated in FIGS. 5, 6, and 7 may further include inner connectors 170 as compared with the semiconductor package 100 illustrated in FIGS. 1, 2, and 3. In FIG. 5, the same reference numerals as used in FIGS. 1 to 4 denote the same elements.

Referring to FIGS. 5, 6, and 7, the semiconductor package 100S may include the first, second, and third chip stacks 120, 130, and 140 disposed on the package substrate 110 and the encapsulant 190 covering the first, second, and third chip stacks 120, 130, and 140. The inner connectors 170 may be disposed to electrically connect the semiconductor chips 121, 131, and 141 included in the first to third chip stacks 120, 130, and 140 to the package substrate 110. First ends of the inner connectors 170 may be electrically connected to the semiconductor chips 121, 131, and 141, and second ends of the inner connectors 170 may be electrically connected to bonding fingers 160 of the package substrate 110. The inner connectors 170 may be bonding wires, for example, metal wires.

The bonding fingers 160 may be disposed on the first surface 111 of the package substrate 110. The bonding fingers 160 may be conductive patterns that are connected to interconnection patterns (not illustrated) included in the package substrate 110. The interconnection patterns may be conductive patterns formed in or on the package substrate 110. The interconnection patterns may electrically connect the bonding fingers 160 to the outer connectors (180 of FIG. 2) disposed on the second surface 112 of the package substrate 110 opposite to the first and second chip stacks 120 and 130.

The bonding fingers 160 may be disposed in first, second, and third bonding finger regions 113E, 114E, and 115E which are respectively located to be adjacent to the first, second, and third edges 113, 114, and 115 of the package substrate 110. The first bonding finger region 113E may be an edge region of the first surface 111, which is adjacent to the first edge 113 of the package substrate 110. The first bonding finger region 113E may be located between the first edge 113 of the package substrate 110 and the first chip stack 120. The second bonding finger region 114E may be located between the second edge 114 of the package substrate 110 and the second chip stack 130. The third bonding finger region 115E may be located between the third edge 115 of the package substrate 110 and the third chip stack 140.

First bonding fingers 162 of the bonding fingers 160 may be disposed in the first bonding finger region 113E. The first bonding fingers 162 may be arrayed in a line parallel to the first edge 113. The first bonding fingers 162 may be disposed to correspond to first bonding pads 152 disposed on each of the first chips 121, respectively. Second bonding fingers 163 of the bonding fingers 160 may be disposed in the second bonding finger region 114E. The second bonding fingers 163 may be arrayed in a line parallel to the second edge 114. The second bonding fingers 163 may be disposed to correspond to second bonding pads 153 disposed on each of the second chips 131, respectively. Third bonding fingers 164 of the bonding fingers 160 may be disposed in the third bonding finger region 115E. The third bonding fingers 164 may be arrayed in a line parallel to the third edge 115. The third bonding fingers 164 may be disposed to correspond to third bonding pads 154 disposed on each of the third chips 141, respectively. Since the third edge 115 connects the first edge 113 to the second edge 114, the first, second, and third bonding fingers 162, 163, and 164 arrayed along the edges 113, 114, and 115 may exhibit a 'U'-shaped form or a horseshoe-shaped form in a plan view.

Bonding pads 150 including the first, second, and third bonding pads 152, 153, and 154 may be disposed on the semiconductor chips 121, 131, and 141 to correspond to the bonding fingers 160. The first bonding pads 152 may be disposed on the first edge regions 121E of the first semiconductor chips 121 included in the first chip stack 120. Since the first semiconductor chips 121 are stacked to be offset, the first edge regions 121E and the first bonding pads 152 might not be covered by the first semiconductor chips 121. Since the first edge regions 121E provide the first up-stair structure 123, the first bonding pads 152 may also be disposed on the first up-stair structure 123.

First inner connectors 172 of the inner connectors 170 may connect the first bonding pads 152 to the first bonding fingers 162. The first inner connectors 172 may extend from the first chip stack 120 toward the first edge 113 of the package substrate 110. The first inner connectors 172 may extend from the first bonding fingers 162 toward the third chip stack 140 along the first up-stair structure 123.

The second bonding pads 153 may be disposed on the second edge regions 131E of the second semiconductor chips 131 included in the second chip stack 130. Since the second semiconductor chips 131 are stacked to be offset, the second edge regions 131E and the second bonding pads 153 might not be covered by the second semiconductor chips 131. Second inner connectors 173 of the inner connectors 170 may connect the second bonding pads 153 to the second bonding fingers 163. The second inner connectors 173 may extend from the second chip stack 130 toward the second edge 114 of the package substrate 110. The second inner connectors 173 may extend from the second bonding fingers 163 toward the third chip stack 140 along the second up-stair structure 133.

The third bonding pads 154 may be disposed on the third edge regions 141E of the third semiconductor chips 141 included in the third chip stack 140. Since the third semiconductor chips 141 are stacked to be offset, the third edge regions 141E and the third bonding pads 154 might not be covered by the third semiconductor chips 141. Third inner connectors 174 of the inner connectors 170 may connect the third bonding pads 154 to the third bonding fingers 164. The third inner connectors 174 may extend from the third chip stack 140 toward the third edge 115 of the package substrate 110. The third inner connectors 174 may extend from the third bonding fingers 164 along the third up-stair structure 143.

Referring again to FIG. 5, the third chip stack 140 may be comprised of a first sub-chip stack 140B located at a relatively lower position and a second sub-chip stack 140U located at a relatively higher position. That is, the second sub-chip stack 140U may be stacked on the first sub-chip stack 140B. Accordingly, the third bonding pads 154 may also be comprised of first sub-bonding pads 154B and second sub-bonding pads 154U. The first sub-bonding pads 154B may belong to the first sub-chip stack 140B, and the second sub-bonding pads 154U may belong to the second sub-chip stack 140U. The third bonding fingers 164 may also be comprised of first sub-bonding fingers 164B and second sub-bonding fingers 164U. The third inner connectors 174 may also be comprised of first sub-connectors 174B and second sub-connectors 174U.

The first sub-connectors 174B may connect the third semiconductor chips 141 included in the first sub-chip stack 140B to the package substrate 110. That is, the first sub-connectors 174B may connect the first sub-bonding pads 154B of the third semiconductor chips 141 included in the first sub-chip stack 140B to the first sub-bonding fingers 164B included in the third bonding fingers 164. The second sub-connectors 174U may connect the third semiconductor chips 141 included in the second sub-chip stack 140U to the package substrate 110. That is, the second sub-connectors 174U may connect the second sub-bonding pads 154U of the third semiconductor chips 141 included in the second sub-chip stack 140U to the second sub-bonding fingers 164U included in the third bonding fingers 164.

The second sub-connectors 174U may be longer than the first sub-connectors 174B. Thus, a long portion 174L of each of the second sub-connectors 174U may undesirably warp or droop. That is, the second sub-connectors 174U may easily droop because each of the second sub-connectors 174U has the long portion 174L for connecting one of the third inner connectors 174 to the second sub-chip stack 140U located at a level which is higher than the first sub-chip stack 140B. In an embodiment, the second sub-connectors 174U may include wires (e.g., metal wires) which are longer than the first sub-connectors 174B.

When the long portions 174L of the second sub-connectors 174U warp or droop downwardly, the second sub-connectors 174U have to be electrically insulated from the first sub-connectors 174B. Thus, the first sub-connectors 174B and the second sub-connectors 174U may be alternately arrayed along a direction parallel with the third edge 115 of the package substrate 110 to increase distances between the first sub-connectors 174B and the second sub-connectors 174U. In such a case, electrical contact between the first sub-connectors 174B and the second sub-connectors 174U may be prevented even though the long portions 174L of the second sub-connectors 174U warp or droop downwardly.

Since the first sub-connectors 174B and the second sub-connectors 174U may be alternately arrayed, the first sub-bonding fingers 164B and the second sub-bonding fingers 164U may also be alternately arrayed in the third bonding finger region 115E along a direction parallel with the third edge 115 of the package substrate 110.

In an embodiment, since the third inner connectors 174 include the first sub-connectors 174B and the second sub-connectors 174U, the number of the third semiconductor chips 141 connected to any one of the first sub-connectors 174B or the second sub-connectors 174U may be equal to the number of the first semiconductor chips 121 connected to any one of the first inner connectors 172. That is, the number of the semiconductor chips 121, 131, or 141 connected to each of the inner connectors 170 may be fixed at a certain value, for example, four. Thus, the number of the first semiconductor chips 121 constituting the first chip stack 120, the number of the second semiconductor chips 131 constituting the second chip stack 130, the number of the third semiconductor chips 141 constituting the first sub-chip stack 140B, and the number of the third semiconductor chips 141 constituting the second sub-chip stack 140U may be equal to each other. Accordingly, the number of the third semiconductor chips 141 constituting the third chip stack 140 may be twice the number of the first semiconductor chips 121 constituting the first chip stack 120. As a result, the total number of the semiconductor chips 121, 131, and 141 embedded in the semiconductor package 100S may increase.

Referring again to FIGS. 5 and 7, the third bonding pads 154 may be disposed to overlap with the first chip stack 120 or the second chip stack 130 when viewed from a plan view. Thus, when the third inner connectors 174 are bonded to the third bonding pads 154, the first or second chip stacks 120 or 130 may stably support the third bonding pads 154. For example, the third inner connectors 174 may be formed using a bonding process. More specifically, when metal wires are bonded to the third bonding pads 154, a certain pressure or a certain shock is applied to the third bonding pads 154. In such a case, the first or second chip stacks 120 or 130 located under the third bonding pads 154 may support the third bonding pads 154 to which the certain pressure or the certain shock is applied. Accordingly, it may be possible to stably bond the metal wires to the third bonding pads 154.

According to embodiments of the present disclosure described above, it may be possible to increase the number of the semiconductor chips 121, 131, and 141 embedded in the semiconductor package 100S having a limited planar area. Thus, the semiconductor package 100S may be effectively employed in electronic devices necessitating a large capacity of memory, for example, in a solid state drive (SSD).

Figure 8:
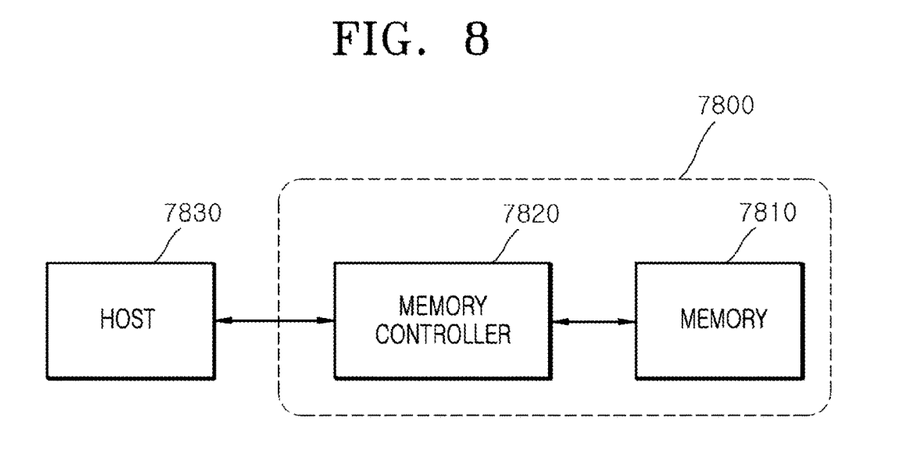
FIG. 8 is a block diagram illustrating an electronic system employing a memory card including a semiconductor package according to an embodiment.

FIG. 8 is a block diagram illustrating an electronic system including a memory card 7800 employing at least one semiconductor package according to embodiments of the present disclosure. The memory card 7800 may include a memory 7810, such as a nonvolatile memory device, and a memory controller 7820. The memory 7810 and the memory controller 7820 may store data or read out the stored data. At least one of the memory 7810 and the memory controller 7820 may include at least one semiconductor package according to embodiments of the present disclosure.

The memory 7810 may include a nonvolatile memory device fabricated according to embodiments of the present disclosure. The memory controller 7820 may control the memory 7810 such that stored data is read out or data is stored in response to a read/write request from a host 7830.

Figure 9:
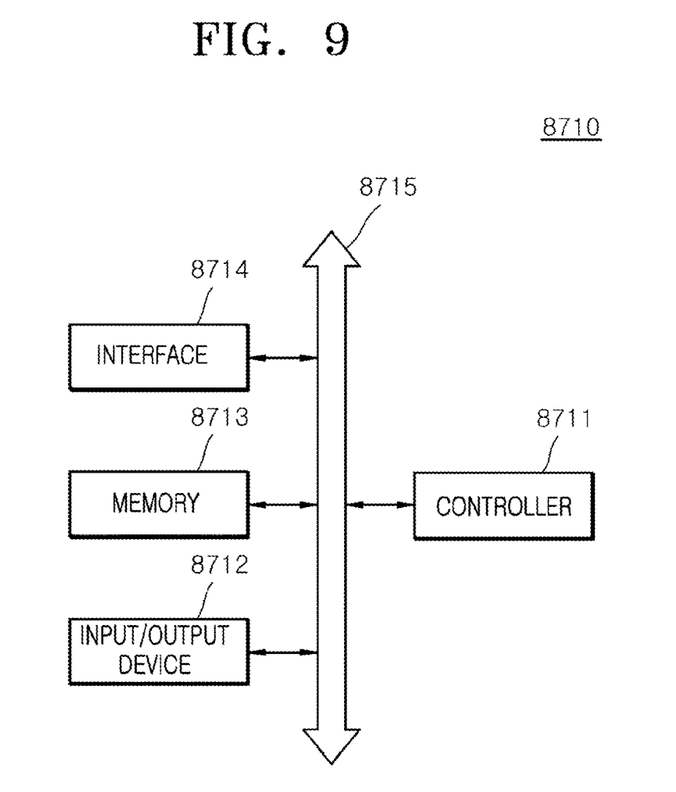
FIG. 9 is a block diagram illustrating another electronic system including a semiconductor package according to an embodiment.

FIG. 9 is a block diagram illustrating an electronic system 8710 including at least one package according to embodiments of the present disclosure. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more semiconductor packages according to embodiments of the present disclosure. The input/output device 8712 may include at least one selected among a keypad, a keyboard, a display device, a touchscreen, and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 is an equipment capable of performing wireless communication, the electronic system 8710 may be used in a communication system using a technique of CDMA (code division multiple access), GSM (global system for mobile communications), NADC (North American digital cellular), E-TDMA (enhanced-time division multiple access), WCDMA (wideband code division multiple access), CDMA2000, LTE (long term evolution) or WiBro (wireless broadband Internet).

Embodiments of the present disclosure have been disclosed for illustrative purposes. Those skilled in the art will appreciate that various modifications, additions, and substitutions are possible without departing from the scope and spirit of the present disclosure and the accompanying claims.

What is claimed is:

1. A semiconductor package comprising:
   a first chip stack including first semiconductor chips which are stacked to be offset on a package substrate;
   a second chip stack including second semiconductor chips which are stacked to be offset on the package substrate;
   a third chip stack including third semiconductor chips which are stacked to be offset and supported by both of the first and second chip stacks;
   connectors having first ends which are connected to the first, second, and third semiconductor chips; and
   bonding fingers connected to second ends of the connectors opposite to the first ends,
   wherein the bonding fingers are arrayed on the package substrate along a first edge of the package substrate, a second edge of the package substrate substantially opposite to the first edge, and a third edge of the package substrate connecting the first edge to the second edge,
   wherein the third semiconductor chips are stacked to reveal third bonding pads disposed on the third semiconductor chips;
   wherein the bonding fingers includes third bonding fingers disposed between the third edge of the package substrate and the third chip stack to correspond to the third bonding pads;
   wherein the third bonding fingers include first sub-bonding fingers and second sub-bonding fingers which are alternately arrayed;
   wherein the third chip stack includes:
   a first sub-chip stack having some of the third semiconductor chips; and
   a second sub-chip stack having the others of the third semiconductor chips which are stacked on the first sub-chip stack; and
   wherein the connectors include:
   first sub-connectors connecting the first sub-bonding fingers to the first sub-chip stack; and
   second sub-connectors connecting the second sub-bonding fingers to the second sub-chip stack.

2. The semiconductor package of claim 1, wherein the bonding fingers are arrayed along the first, second, and third edges of the package substrate to exhibit a substantially horseshoe-shaped form.

3. The semiconductor package of claim 1, wherein the bonding fingers include:
   first bonding fingers disposed in a region between the first edge of the package substrate and the first chip stack;
   second bonding fingers disposed in a region between the second edge of the package substrate and the second chip stack; and
   third bonding fingers disposed in a region between the third edge of the package substrate and the third chip stack.

4. The semiconductor package of claim 1,
   wherein the first semiconductor chips are stacked to reveal first bonding pads disposed on the first semiconductor chips; and
   wherein the second semiconductor chips are stacked to reveal second bonding pads disposed on the second semiconductor chips.

5. The semiconductor package of claim 4, wherein the bonding fingers include:
   first bonding fingers disposed between the first edge of the package substrate and the first chip stack to correspond to the first bonding pads; and
   second bonding fingers disposed between the second edge of the package substrate and the second chip stack to correspond to the second bonding pads.

6. The semiconductor package of claim 1, wherein the second sub-connectors include wires which are longer than the first sub-connectors.

* * * * *